United States Patent [19]

Machol et al.

[11] 4,245,324

[45] Jan. 13, 1981

[54] COMPACT PROGRAMMABLE LOGIC READ ARRAY HAVING MULTIPLE OUTPUTS

[75] Inventors: Guenther K. Machol, Saratoga; Jon L. Cross, San Jose, both of Calif.

[73] Assignee: International Business Machines Corporation, Armonk, N.Y.

[21] Appl. No.: 970,083

[22] Filed: Dec. 15, 1978

[51] Int. Cl.³ .......................................... H03K 19/20
[52] U.S. Cl. ..................................... 364/716; 307/207
[58] Field of Search ...................... 364/716; 307/207; 340/166 R

[56] References Cited

U.S. PATENT DOCUMENTS

| | | | |
|---|---|---|---|
| 3,974,366 | 8/1976 | Hebenstreit | 364/716 |
| 4,041,459 | 8/1977 | Horninger | 340/166 R |
| 4,084,152 | 4/1978 | Long et al. | 364/716 X |
| 4,124,899 | 11/1978 | Birkner et al. | 364/716 |

Primary Examiner—David H. Malzahn
Attorney, Agent, or Firm—Otto Schmid, Jr.

[57] ABSTRACT

A programmable logic array (PLA) comprising a search array in which the logical AND of one or more inputs (product terms) is formed and coupled to a read array in which each output is formed from a logical OR of one or more of the inputs from the search array. The array has a plurality of output circuits and each output circuit comprises a plurality of physical gates (one gate for each product term input), a common drain diffusion, a load device and an output connection. A plurality of output circuits is formed in each column of the read array and, where circuits overlap so that they cannot be placed in the same column, they are placed in adjacent columns. Where a plurality of outputs share a common product term, gates driven by the same product term are placed in adjacent columns, where they are connected by metal to the common product term ouptut from the search array. The ability to take outputs from the top, side or bottom of the array and to take a plurality of outputs from each column of the read array minimizes the area required for the array and produces performance improvements in array operation.

12 Claims, 8 Drawing Figures

COMPACT PROGRAMMABLE LOGIC READ ARRAY HAVING MULTIPLE OUTPUTS

BACKGROUND OF THE INVENTION

1. Field of the Invention

The present invention relates to integrated circuits and more particularly to programmable logic arrays, herein referred to as PLA's.

2. History of the Prior Art

In recent years it has become more prevalent to implement logic functions using large scale monolithic integrated circuit techniques developed for more structured circuits such as shift registers and read only storage devices. These logic circuits are referred to as programmable logic arrays (PLA's).

A PLA is a structure consisting of an associative or search array coupled to a read array. The associative array performs logical AND operations on the inputs, while the read array combines the contents of the selected words so that the outputs are the result of logically ORing selected words. Since any combinational logic circuit can be written as a sum of products or as a product of sums, the first programmable array, the search or AND array, is designed to generate the product terms and the second programmable array, the read or OR array, is designed to generate the sum of the product terms.

In a conventional read array structure, the load devices are placed along the top and/or bottom of the array. In this arrangement of the load devices, the length of the drain diffusion, from the load device to the furthest physical gate, determines the capacitance and resistance of the diffusion, which in turn determines the speed and signal level variation of that particular output. In addition, the area required by the array, being determined by the number of outputs, remains fixed and large even if the number of gates is a minimum.

One exception to the prior art array structure is described in the publication "Programmable Logic Array With Increased Personalization Density" by D. A. Conrad et al, IBM Technical Disclosure Bulletin, Vol 19, No. 7, Dec., 1976, pages 2628-9, in which load devices associated with single gates may be placed along the side of the array.

SUMMARY OF THE INVENTION

It is therefore the object of the invention to provide an improved read array structure for a PLA.

It is another object of this invention to provide a PLA having higher logic power per unit area for complex logical functions than has been achieved in the prior art.

It is a further object of this invention to provide a PLA requiring less chip area per elementary logical function than has been required in the prior art.

A PLA in accordance with the invention employs a search array for forming a plurality of product term outputs and the product term outputs are coupled as inputs to a read array. The read array includes a plurality of output circuits in a column with each output circuit having a plurality of gates with one gate for each product term input, a common drain diffusion, a load device and an output connection.

In one preferred arrangement according to the invention the product terms in the search array are arranged so that those product terms associated with a particular output circuit are located side by side. With this arrangement one output circuit can be provided at the top of the array in the same column of the read array as an output circuit provided at the bottom of the array and which also includes, in the same column, one or more output circuits whose load device and output connection are provided at the side of the array. In an alternative arrangement, where one output circuit has a product term input in common with one of the other output circuits, the output circuits are placed in adjacent columns and conductors are provided to connect the common product term output to both output circuits. In the same manner, where a plurality of output circuits in the same column of the read array share a common product term output, a gate is provided between each of the output circuits and its load device and conductors are provided to interconnect the gates with the common product term input.

DESCRIPTION OF THE PREFERRED EMBODIMENTS

Figure 1:
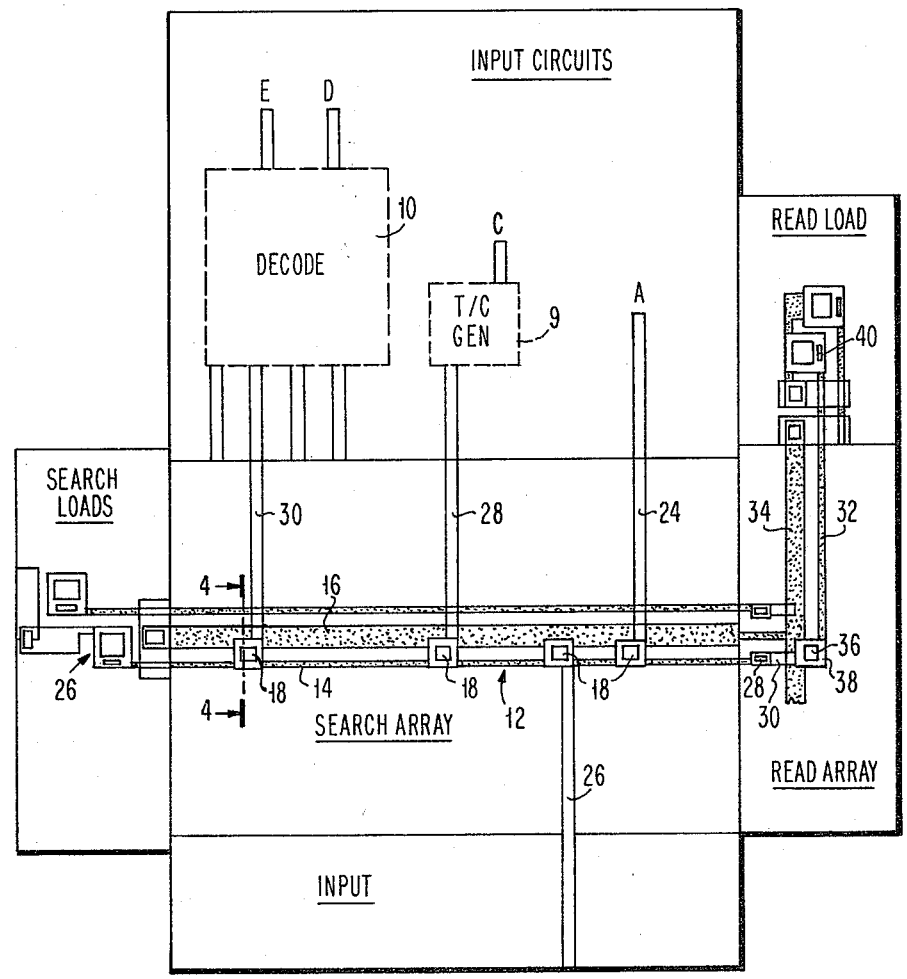
FIG. 1 is a diagram showing the typical parts of a PLA and their functional relation.

This invention is broadly applicable to all PLA's which will be briefly described by reference to FIG. 1 by way of background to the invention. The PLA shown in FIG. 1 comprises an input section, a search array, and a read array all formed in suitable circuits such as MOS transistors in monolithic integrated circuit form. The input section comprises inputs to the top and bottom of the array as shown in FIG. 1, and the inputs shown include input A from the top of the chip and input B from the bottom of the chip. Input C and its complement $\overline{C}$ are provided by true/complement generator 9 at the top of the chip. Inputs D and E are provided at the top of the chip and these inputs are coupled to decode logic 10 to provide four decoded inputs as shown in FIG. 1. Note that the five inputs A, B, C, D, and E result in 8 input lines to the search array of FIG. 1. The number and arrangement of inputs to a PLA is a matter of design choice and some of the considerations in this and other designs are discussed in "An Introduction to Array Logic" by H. Fleisher and L. I. Maissel, IBM Journal of Research and Development, Vol. 19, No. 2, March, 1975, p. 98.

Figure 4:
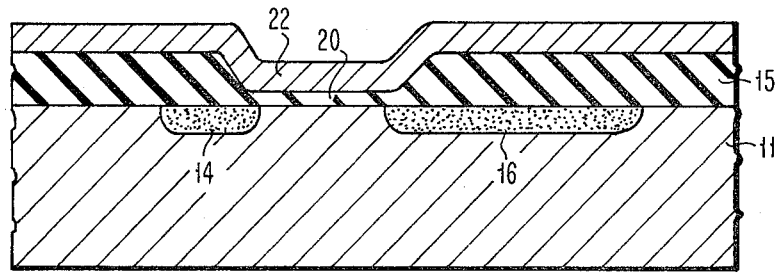
FIG. 4 is a section view taken along the lines 4—4 of FIG. 1.

The search array comprises a plurality of product terms of which only product term 12 is shown in detail. The structure which produces the product term comprises a common drain diffusion 14 which extends across the array and common ground diffusion 16 which is parallel to and closely spaced from drain diffusion 14. A gate 18 is formed for each of the inputs which is a factor in the product term. The forming of a gate at selected positions is a "programmable" part of the logic array. The formation of a gate can be best understood by referring to FIG. 4. After the substrate 11 is processed to form the diffusions 14 and 16, a uniform relatively thick oxide layer 15 is produced over the surface of the substrate 11. At locations in which a gate is to be produced, the oxide is etched in an area spanning the drain diffusion 14 and ground diffusion 16 to produce a thin oxide area 20. A metal conductor 22 is then deposited over area 20 to form a metallized gate, and the resulting structure may comprise a FET enhancement type device, for example, A metal conductor is coupled from metallized gate 22 to the appropriate input terminal. In the product term 12 shown in FIG. 1, gates 18 are produced and these gates are coupled by conductor 24 to input A, by conductor 26 to input B, by conductor 28 to input C̄, and by conductor 30 to one of the decoded inputs.

Diffusion 14 extends to the left as seen in FIG. 1 to a load device 26 and to the right to the edge of the search array. An opening 28 is etched through the oxide coating adjacent the end of the diffusion so that conductor 30 can be deposited to couple this product term to the appropriate column(s) in the read array. Diffusions 32 and 34 define a column which extends along the read array at substantially right angles to the diffusion rails in the search array. The product term is coupled to the appropriate read output(s) by selectively programmable gate(s) which is(are) formed as previously described and shown in FIG. 4. The gate 36 is shown in the drawing formed by drain diffusion 32, ground diffusion 34, and metallized gate 38 which is electrically connected to conductor 30. Read load 40 is provided for the OR term shown in FIG. 1.

Figure 2:
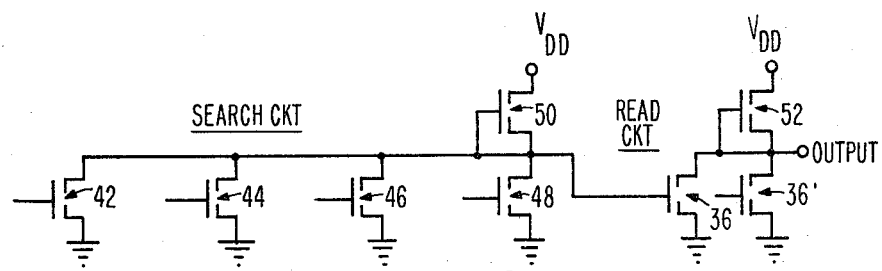
FIG. 2 is a schematic diagram of one product term for the diagram of FIG. 1.

The schematic of the structure shown in FIG. 1 is shown in FIG. 2. MOS transistors 42, 44, 46, 48 are shown in parallel and a voltage source $V_{DD}$ is coupled to the circuit through transistor 50. The read circuit comprises gate transistor 36, load transistor 52, and other gate transistors 36'.

Figure 3:
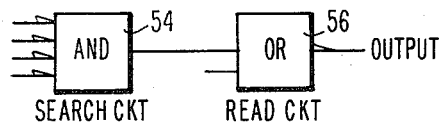
FIG. 3 is a logic block diagram of the schematic diagram shown in FIG. 2.

The four transistors in parallel form AND circuit 54 as shown in FIG. 3 and OR circuit 56 is formed by the read array transistors.

Figure 5:
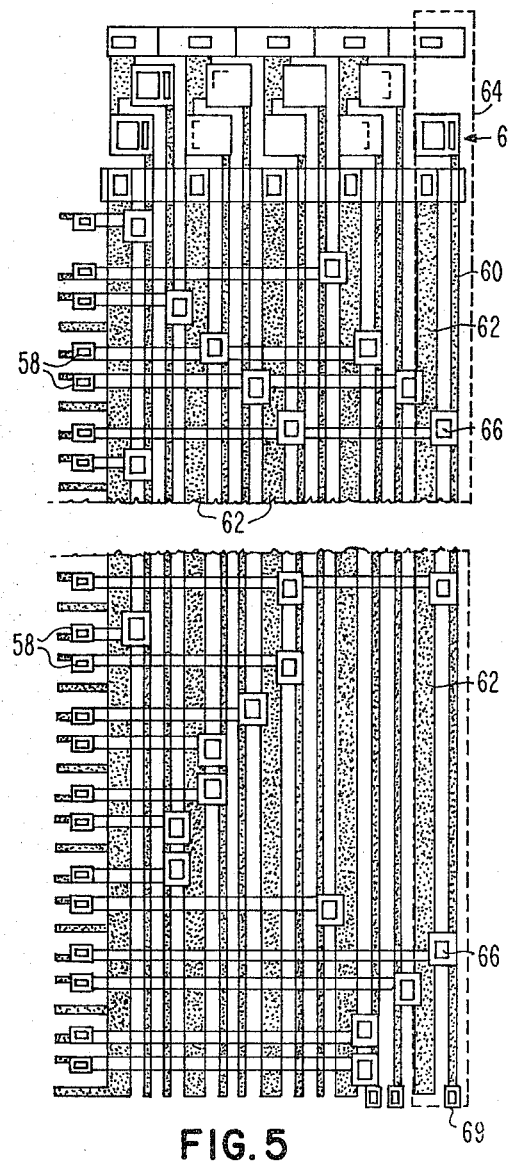
FIG. 5 is a diagram showing the layout on a semiconductor chip for a particular read array designed according to prior art techniques.

A read array designed in accordance with prior art techniques is shown in FIG. 5. The ends of the diffusion for the search array are shown on the left and a plurality of terminals 58 are provided to electrically connect the corresponding product term to the conductors which extend into the read array. Diffusion rails are produced which run the full length of the read array substantially at right angles to the search array diffusion rails. Narrow diffusion rails 60 produce the drain diffusion and wider diffusion 62 produces the ground diffusion when gates are produced to couple the product term to the appropriate read array output. One output (OR) circuit 64 is shown in dotted outline in FIG. 5. The output circuit comprises a physical gate 66 for each desired product term input, a common ground diffusion 62, a common drain diffusion 60, a load device 68 and a connection 69 from which the output signal is taken. The output signal is taken at the end of the array opposite the load since there is no convenient way in this arrangement to couple the output signal from the load end of the array. In this arrangement the drain diffusion runs from the farthest gate to the load device, and the capacitance and resistance resulting from this design adversely affect circuit performance.

Figure 6:
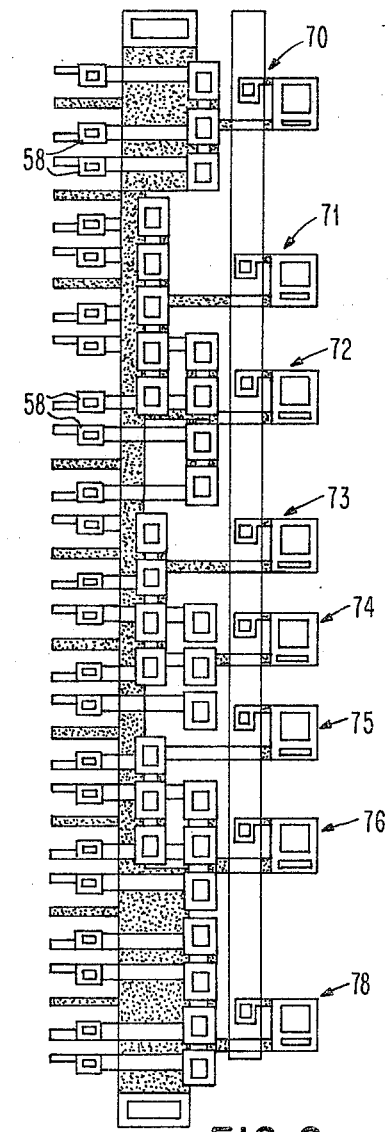
FIG. 6 is a diagram showing the layout on a semiconductor chip for a read array functionally equivalent to the read array of FIG. 5 but designed in accordance with the present invention.

A read array functionally equivalent to the read array of FIG. 5 is shown in FIG. 6. However, the structure of this array produces greatly improved circuit performance as well as requiring considerably less chip area for the two columns of diffusions in the read array as compared to the nine in the FIG. 5 design. The structure which permits this advantageous design utilizes a plurality of side output circuits for the read array. Terminals 58 are provided as before but the order of the product terms from top to bottom in the search array is rearranged so that the read array gates for each output circuit are grouped in close proximity. Neither the area nor the performance of the search array will be adversely affected by any such arrangement. The circuits for different outputs are then placed in the same vertical column wherever possible. Where circuits overlap so that they cannot be placed in the same column, they are placed in adjacent columns, thereby preserving the side output compactness. As shown in FIG. 6, output circuits 71, 73, and 75 have their gates in the second column of the read array and output circuits 70, 72, 74, 76, 77, and 78 have their gates in the first column of the read array.

Figure 7:
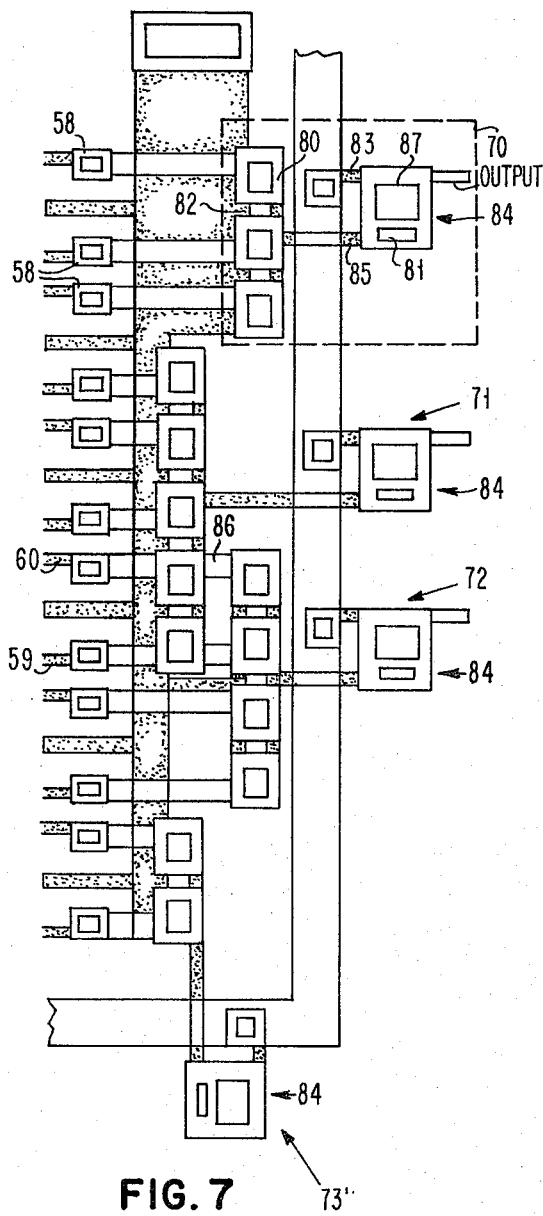
FIG. 7 is a diagram showing the output circuits of the FIG. 6 design in greater detail.

As shown in greater detail in FIG. 7, the three gates associated with output circuit 70 are formed by common drain diffusion 80 and a common ground diffusion 82. Metal is deposited to extend from terminals 58 to metallized gates formed to complete the gates for the read array. Output circuit 71 comprises five gates and output circuit 72 comprises four gates and two of these product terms are common to the two output circuits. In this case the output circuits are formed in adjacent columns and the common connections are made through metal extensions 86. Output circuit 73 (FIG. 6) has four gates located in the first column of the read array and it shares with output circuit 74 two of the product term outputs. In each of the output circuits shown in FIG. 7 a load device 84 is located close to the common drain diffusion, and the load device 84 for output circuit 73' is placed at the bottom of the array. In the embodiment shown, (see FIG. 7) load devices 84 comprise spaced diffusions 83, 85, and a gate electrode 87 to produce a FET transistor. An opening 81 is provided in the oxide layer to permit the metal to contact the drain diffusion to produce a saturated connection for the load device. This structure provides a performance improvement since the diffusion capacitance and resistance of the side output spans are minimized and a space enhancement is provided as well due to the placement of a plurality of output circuits in each column of the read array.

In those cases in which a multiplicity of outputs has a common product term, which would normally prevent the side output circuits from occupying the same column, those gates driven by the same product term are moved to a separate but adjacent column where they are connected by metal to the common product term. A read array incorporating this structure is shown in FIG. 8.

Figure 8:
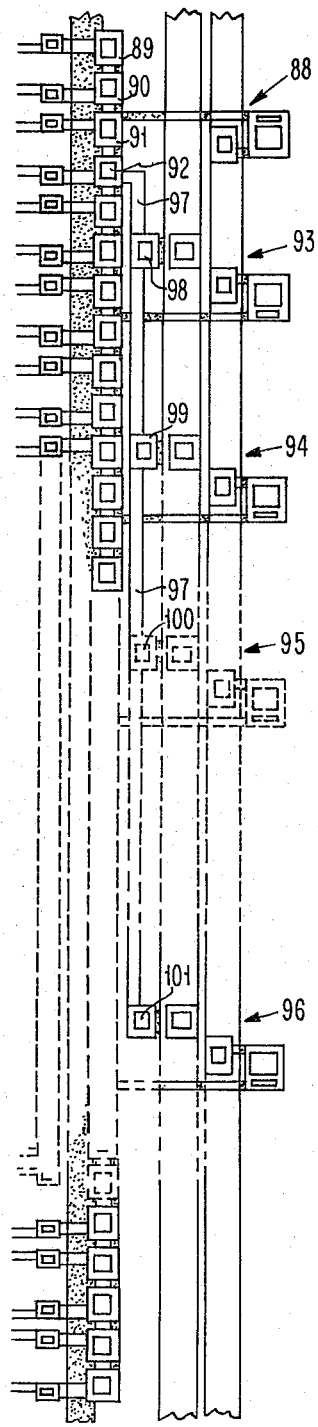
FIG. 8 is a diagram showing a portion of a modified arrangement of output circuits according to the present invention.

In FIG. 8 the frst output circuit 88 has four gates 89, 90, 91, and 92 for the associated product terms. The product term associated with gate 92 is also common to output circuits 93, 94, 95, and 96. The connection to the other product terms is made with metal conductor means 97 which connects gate 92 and gate 98. In the same manner interconnecting metal is provided to produce gates 99, 100, and 101 to connect the product term associated with gate 92 to each of the output spans 94, 95, and 96 respectively. This structure permits the read array to be implemented in only two columns and still preserve the compact side output structure.

While the invention has been particularly shown and described with reference to preferred embodiments thereof, it will be understood by those skilled in the art that various changes in the form and details may be made therein without departing from the spirit and scope of the invention.

Having thus described our invention, what we claim as new, and desire to secure by Letters Patent is:

1. A programmable logic array comprising:
    a search array forming a plurality of product term outputs;
    a read array and means for coupling each product term output as an input to said read array;
    said read array comprising a plurality of output circuits including a first plurality of output circuits serially arranged in a first column;
    a plurality of gate means comprising one gate means for each product term input;
    each of said output circuits comprising:
    a predetermined plurality of said gate means with one gate means for each product term input to that output circuit;
    a common drain diffusion for said predetermined plurality of gate means;
    a load device;
    an output connection; and
    means for connecting said common drain diffusion to said load device and to said output connection.

2. The programmable logic array of claim 1 additionally comprising;
    at least one of said output circuits being formed in a second column of said read array;
    said at least one of said output circuits having at least one product term input in common with one of said product term inputs to one of said first plurality of output circuits in said first column; and
    means for connecting the common product term input from said one of said first plurality of output circuits to the corresponding product term input in said at least one of said output circuits.

3. The programmable logic array of claim 1 wherein a second plurality of output circuits in said first column and a second column share a common product term input with one of said first pluralty of output circuits;
    said second plurality of output circuits further including gate means in said second column; and
    conductor means for interconnecting said gate means in each of said second plurality of output circuits.

4. The array according to claim 1 wherein at least one of said load devices is placed at the end of a column and at least one of said load devices is placed at the side of said column.

5. The array according to claim 1 wherein said load device comprises a field effect transistor and said output connection is taken from the gate electrode of said transistor.

6. The array according to claim 1 wherein at least two of said load devices are placed at the side of said column.

7. A programmable logic array comprising: a search array comprising a plurality of product term circuits, each having a product term output; said product terms arranged in a predetermined order wherein predetermined groups of outputs are formed with outputs within a group adjacently located;
    a read array comprising a plurality of columns extending substantially transverse to said product terms outputs;
    a plurality of gate means including gate means for coupling each product term output in a first plurality of said predetermined groups as an input to a first column of said ready array;
    said ready array comprising a first plurality of output circuits each corresponding to one of said first plurality of said predetermined groups arranged in said first column;
    each of said output circuits comprising:
    said gate means for coupling each product term output an an input to said predetermined group;
    a common drain diffusion for said gate means for coupling each product term output as an input to said predetermined group;
    a load device;
    an output connection; and
    means for connecting said common drain diffusion to said load device and to said output connection.

8. The programmable logic array of claim 7 additionally comprising:
    at least one of said output circuits being formed in a second column of said ready array;
    said at least one of said output circuits having at least one product term input in common with one of said product term inputs to one of said first plurality of output circuits in said first column; and
    means for connecting the common product term input from said one of said first plurality of output circuits to the corresponding product term output in said at least one of said output circuits.

9. The programmable logic array of claim 7 wherein a second plurality of output circuits in said first column and a second column share a common product term input with one of said first plurality of output circuits;
    said second plurality of output circuits further including gate means in said second column; and
    conductor means for interconnecting said gate in each of said second plurality of output circuits.

10. The array according to claim 7 wherein at least one of said load devices is placed at the end of a column and at least one of said load devices is placed at the side of said column.

11. The array according to claim 7 wherein said load device comprises a field effect transistor and said output connection is taken from the gate electrode of said transistor.

12. The array according to claim 7 wherein at least two of said load devices are placed at the side of said column.

* * * * *